(12) United States Patent
Ishii et al.

(10) Patent No.: US 8,803,578 B2
(45) Date of Patent: Aug. 12, 2014

(54) PULSE WIDTH ADJUSTING CIRCUIT AND METHOD

(71) Applicant: International Business Machines Corporation, Armonk, NY (US)

(72) Inventors: Masatoshi Ishii, Shiga-ken (JP); Gen Yamada, Shiga (JP); Hisatada Miyatake, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,918

(22) Filed: Nov. 30, 2012

(65) Prior Publication Data

US 2013/0141147 A1 Jun. 6, 2013

(30) Foreign Application Priority Data

Dec. 2, 2011 (JP) .................................. 2011-264819

(51) Int. Cl.
*H03K 5/04* (2006.01)
*H03K 7/08* (2006.01)

(52) U.S. Cl.
USPC ........... 327/172; 365/223; 365/233; 327/173; 327/175; 327/176; 327/174

(58) Field of Classification Search
USPC ..................... 327/165, 166, 170, 172, 176
See application file for complete search history.

(56) References Cited

U.S. PATENT DOCUMENTS

| | | | | | |
|---|---|---|---|---|---|
| 5,633,833 | A | * | 5/1997 | Yoon | 365/230.08 |
| 6,057,709 | A | * | 5/2000 | Hesley | 326/54 |
| 6,094,080 | A | * | 7/2000 | Jeong et al. | 327/176 |
| 6,369,615 | B1 | * | 4/2002 | Shimizu et al. | 326/93 |
| 6,608,513 | B2 | * | 8/2003 | Tschanz et al. | 327/218 |
| 7,075,352 | B2 | * | 7/2006 | Kim et al. | 327/291 |
| 7,170,325 | B2 | * | 1/2007 | Lee | 327/172 |

FOREIGN PATENT DOCUMENTS

| | | |
|---|---|---|
| JP | 10242817 A | 9/1998 |
| JP | 2001223569 A | 8/2001 |
| JP | 3444975 B2 | 9/2003 |
| JP | 3903588 B2 | 4/2007 |

* cited by examiner

*Primary Examiner* — Brandon S Cole

(74) *Attorney, Agent, or Firm* — L. Jeffrey Kelly; Joseph Petrokaitis; Ian Mackinnon

(57) ABSTRACT

The pulse width adjusting circuit includes a pulse delaying circuit for inputting an inputted pulse signal a and for outputting a plurality of different delayed pulse signals b1, b2, . . . , a transmission gate for inputting an inputted pulse signal a and controlling the passage of the inputted pulse signal a in response to the application of two delayed pulse signals from among the plurality of different delayed pulse signals b1, b2, . . . , and a pulse width setting circuit connected to the transmission gate for setting the pulse width of an outputted pulse signal c generated on the basis of the inputted pulse signal a passing through the transmission gate.

19 Claims, 6 Drawing Sheets

|  | Amount of Delay a-c | Vs. Circuit 100 ||
|---|---|---|---|
|  |  | Difference on Amount of Delay Δ | Rate of Reduction in Amt. of Delay |
| Circuit 100 | 9.6ps | — | — |
| Circuit 400 | 3.2ps | -6.4ps | -67% |
| Circuit 800 | 2.5ps | -7.1ps | -74% |
| Circuit 1000 | 3.5ps | -6.1ps | -64% |

(B)

|  | Amount of Delay a-c | Vs. Circuit 100 ||
|---|---|---|---|
|  |  | Difference on Amount of Delay Δ | Rate of Reduction in Amt. of Delay |
| Circuit 200 | 12.4ps | — | — |
| Circuit 600 | 2.8ps | -9.6ps | -77% |

PULSE WIDTH ADJUSTING CIRCUIT AND METHOD

CLAIM OF PRIORITY

The present application claims the benefit of priority of JP patent application 2011-264819, entitled "PULSE WIDTH ADJUSTING CIRCUIT AND METHOD", filed Dec. 2, 2011, with the Japanese Patent and Trademark Office, the content of which is incorporated herein by reference in its entirety.

TECHNICAL FIELD

The present invention relates to the processing of pulse signals and, more specifically, to a pulse width adjusting circuit and method for adjusting the pulse width of pulse signals.

BACKGROUND

When the pulse width of pulse signals has to be adjusted by extending or shortening the pulse width, a circuit configuration is used in which the pulse width is extended or shortened using a logic gate. In a circuit configuration using a logic gate, a delay occurs in the leading edge of pulse signals whose pulse width has been adjusted.

One example of a pulse width delaying circuit of the prior art is shown in FIG. 1. This pulse width delaying circuit 100 has a pulse delaying circuit 110 and an OR gate 120. The pulse width delaying circuit 110 is an even number of two or more inverters, NOT circuits, connected in series. The OR gate 120 is an inverter connected in series to a two-input NOR (negated OR) circuit. The pulse delaying circuit 110 generates a delayed pulse signal b from the inputted pulse signal a, the OR gate 120 generates a logical sum of inputted pulse signal a and delayed pulse signal b, and an outputted pulse signal c with an extended pulse width is generated.

One example of a pulse width shortening circuit of the prior art is shown in FIG. 2. This pulse width shortening circuit 200 is composed of a pulse delaying circuit 210 and an AND gate 220. The pulse delaying circuit 210 is an odd number of inverters connected in series. The AND gate 220 is an inverter connected in series to a two-input NAND (negated AND) circuit. The pulse delaying circuit 210 generates a delayed pulse signal b from the inputted pulse signal a, the AND gate 220 generates a logical product of the inputted pulse signal a and the delayed pulse signal b, and an outputted pulse signal c with a shortened pulse width is generated.

Because the pulse width extending circuit 100 and the pulse width shortening circuit 200 are circuit configurations using, respectively, an OR gate 120 and an AND gate 220, a delay occurs at the leading edge of an outputted pulse signal c whose pulse width has been adjusted, and this delay has to be minimized in circuit designs requiring precise timing.

A signal change detecting circuit for generating a pulse signal with a predetermined pulse width is disclosed in JP Patent No. 3,903,588, in which a transfer gate and a fuse circuit for controlling the ON/OFF state of the transfer gate are provided.

A pulse width extending circuit is disclosed in JP Patent No. 3,444,975, in which a logical sum of an inputted pulse signal and extended pulse signal of this is generated, and the pulse width is extended.

A pulse width varying circuit is disclosed in Japanese Laid-open Patent Publication No. 10-242817, in which the circuit has a transfer gate through which an inputted pulse signal passes, and in which the transfer gate is controlled by a control signal not based on the inputted pulse signal.

A pulse width extending circuit is disclosed in Japanese Laid-open Patent Publication No. 2001-223569, in which a plurality of buffers are connected in series in three steps, the buffers are connected in series via AND gates between each step, an OR operation is performed on the input signal at the final third-step input end, the output signals of each step, and the output signal at the final third-step output end, and the pulse width is extended.

SUMMARY OF INVENTION

The purpose of the present invention is to realize a pulse width adjusting circuit and method able to reduce the leading edge delay of pulse signals whose pulse width has been adjusted. The purpose of the present invention may include the provision of such a pulse width adjusting circuit and method.

The pulse width adjusting circuit in the first aspect provided by an embodiment of the invention includes a pulse delaying circuit for inputting an inputted pulse signal and for outputting a plurality of different delayed pulse signals, a transmission gate for inputting an inputted pulse signal and controlling the passage of the inputted pulse signal in response to the application of two delayed pulse signals from among the plurality of different delayed pulse signals, and a pulse width setting circuit connected to the transmission gate for setting the pulse width of an outputted pulse signal generated on the basis of the inputted pulse signal passing through the transmission gate.

In one embodiment, the transmission gate is turned on until the leading edge of the inputted pulse signal passes by applying the two delayed pulse signals, is turned off before passage of the trailing edge of the inputted pulse signal, and is turned off when the outputted pulse signal reaches a predetermined pulse width or thereafter.

In one embodiment, the pulse width setting circuit is maintained in a state displaced by the leading edge of the inputted pulse signal while the outputted pulse signal is a predetermined pulse width when the transmission gate has been turned off.

In one embodiment, the pulse delaying circuit is an even number of four or more inverters connected in series, three different delayed pulse signals are outputted from the first, second and third inverters counting from the output end, and the two delayed pulse signals outputted from the first and second inverters are applied, respectively, to the first gate and second gate of the transmission gate.

In one embodiment, the pulse width setting circuit includes another transmission gate connected to the pulse delaying circuit for inputting the delayed pulse signal outputted from the third inverter counting from the output end, and for controlling the passage of the inputted delayed pulse signal in response to the application of the two delayed pulse signals outputted from the first and second inverters, respectively, to the second gate and the first gate.

In one embodiment, the pulse delaying circuit is an odd number of three or more inverters connected in series, two different delayed pulse signals are outputted from the first and second inverters counting from the output end, and the two delayed pulse signals outputted from the first and second inverters are applied, respectively, to the second gate and first gate of the transmission gate.

In one embodiment, the inputted pulse signal is a rising pulse (rising at the start and falling at the end), and the pulse width setting circuit includes a PFET (P-type FET) which is connected between the power supply voltage and the output of the transmission gate and which has a gate connected to the output of the first inverter counting from the output end.

In one embodiment, the inputted pulse signal is a rising pulse, and the pulse width setting circuit is an inverter whose input is connected to the output of the transmission gate, and a PFET which is connected between the power supply voltage and the output of the transmission gate and which has a gate connected to the output of the inverter.

In one embodiment, the pulse delaying circuit is an even number of two or more inverters connected in series, two different delayed pulse signals are outputted from the first and second inverters counting from the output end, and the two delayed pulse signals outputted from the first and second inverters are applied, respectively, to the first gate and second gate of the transmission gate.

In one embodiment, the inputted pulse signal is a rising signal, and the pulse width setting circuit is an NFET (N-type FET) which is connected between the ground voltage and the output of the transmission gate and which has a gate connected to the output of the first inverter counting from the output end.

The pulse width adjusting method in the first aspect provided by the present invention includes the steps of generating a plurality of different delayed pulse signals from an inputted pulse signal, applying two of the delayed pulse signals from among the plurality of different delayed pulse signals to the transmission gate, and controlling the passage of the inputted pulse signal through the transmission gate, and setting the pulse width of the outputted pulse signal generated on the basis of the inputted pulse signal passing through the transmission gate to a predetermined pulse width.

In one embodiment, controlling the passage of the inputted pulse signal through the transmission gate includes turning on the transmission gate until the leading edge of the inputted pulse signal passes by applying the two delayed pulse signals, turning off the transmission gate before passage of the trailing edge of the inputted pulse signal, and turning off the transmission gate when the outputted pulse signal reaches a predetermined pulse width or thereafter.

In one embodiment, setting the pulse width of the inputted pulse signal to a predetermined pulse width includes maintaining a state displaced by the leading edge of the inputted pulse signal while the outputted pulse signal is a predetermined pulse width when the transmission gate has been turned off.

The present invention realizes a pulse width adjusting circuit and method able to reduce the leading edge delay of pulse signals whose pulse width has been adjusted. More specifically, the leading edge delay of pulse signals that occurs when the pulse width is extended or shortened can be significantly reduced.

BRIEF DESCRIPTION OF DRAWINGS

FIG. 12 (A) is a table showing the rate of reduction in the leading edge delay of the pulse width adjusting pulse signals of the circuits shown in FIG. 4, FIG. 8 and FIG. 10, and FIG. 12 (B) is a table showing the rate of reduction in the leading edge delay of the pulse width adjusting pulse signals of the circuits shown in FIG. 6.

DETAILED DESCRIPTION

The following is a detailed explanation of a preferred mode of embodying the present invention with reference to the drawings. However, the embodiment explained below does not limit the present invention in the scope of the claims, and all of the combinations of characteristics explained in the embodiment are not necessarily essential to the solution of the present invention. The present invention can be embodied in many different modes, and should not be construed as limited to the contents of the described embodiment. In addition, the same components and elements are denoted by the same numbers throughout the description of the embodiment.

Figure 3:
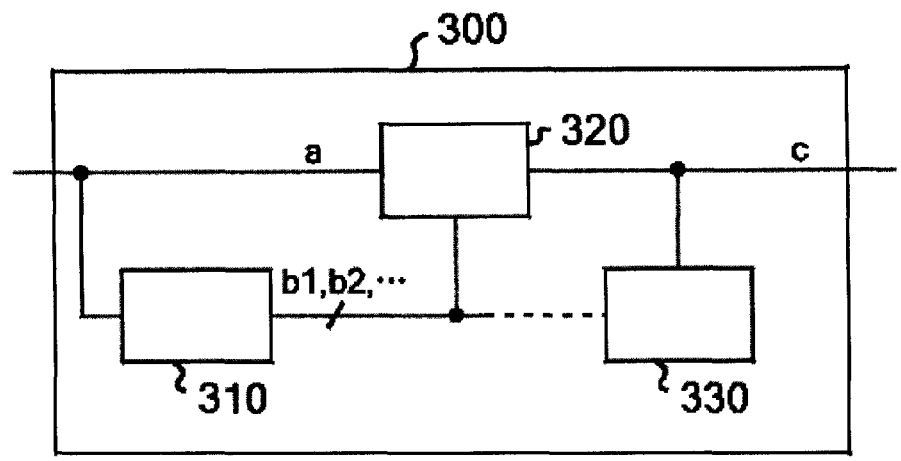
FIG. 3 is a circuit diagram of a pulse width adjusting circuit according to a first embodiment of the present invention.

FIG. 3 shows a diagram of the pulse width adjusting circuit 300 according to an embodiment of the present invention. The pulse width adjusting circuit 300 includes a pulse delaying circuit 310, a transmission gate 320, and a pulse width setting circuit 330. The pulse delaying circuit 310 inputs an inputted pulse signal a, and outputs a plurality of different delayed pulse signals b1, b2, etc. The transmission gate 320 inputs an inputted pulse signal a, and controls the passage of the inputted pulse signal a in response to the application of two delayed pulse signals among the plurality of different delayed pulse signals b1, b2, etc. In particular, the transmission gate 320 is turned on until the leading edge of the inputted pulse signal a has passed by the application of the two delayed pulse signals, is turned off before the trailing edge of the inputted pulse signal a passes, and is turned on when the outputted pulse signal c reaches a predetermined pulse width or thereafter. The pulse width setting circuit 330 is connected to the output of the transmission gate 320, and sets the pulse width of the outputted pulse signal c generated on the basis of the inputted pulse signal a passing through the transmission gate 320. In particular, the pulse width setting circuit 330 is maintained in a state modified by the leading edge of the inputted pulse signal a while the outputted pulse signal c has a predetermined pulse width when the transmission gate 320 is turned off. The pulse width setting circuit 330 is connected to the pulse delaying circuit 310 as indicated by the dotted line. In this way, it can be configured so that the plurality of different pulse signals b1, b2, etc. outputted from the pulse delaying circuit 310 are selected and used by the pulse width setting circuit 330, or not used at all.

Figure 4:
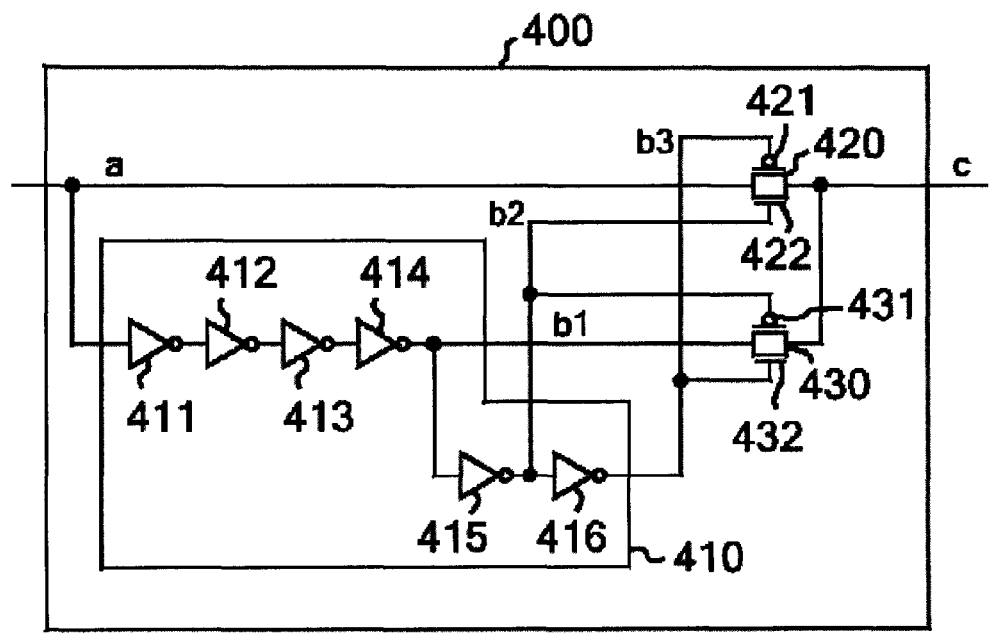
FIG. 4 is a circuit diagram showing the first example of the pulse width adjusting circuit.

FIG. 4 shows one example of a pulse width adjusting circuit 400. The pulse width adjusting circuit 400 is operated to extend the pulse width of pulse signals. In the pulse width adjusting circuit 400, a rising pulse is used in the inputted pulse signals a. The pulse delaying circuit 410 is six series-connected inverters 411-416, and three different delayed pulse signals b3, b2, b1 are outputted on the output end from the first, second and third inverters 416, 415, 414. The transmission gate 420 has a first gate 421 and a second gate 422. The delayed pulse signal b3 outputted from the first inverter 416 is applied to the first gate 421, and the delayed pulse signal b2 outputted from the second inverter 415 is applied to the second gate 422. By applying delayed pulse signals b3 and b2 to the first gate 421 and the second gate 422, respectively, the transmission gate 420 is controlled so as to be turned on until the leading edge of the inputted pulse signal a has passed, so as to be turned off before the trailing edge of the inputted pulse signal a has passed, and so as to be turned on when the outputted pulse signal c reaches a predetermined pulse width. (See the operation waveform diagram from a simulation of the circuit 400 shown in FIG. 5).

Another transmission gate 430 connected to the output of the transmission gate 420 creates a pulse width setting circuit. This other transmission gate 430 is connected to the pulse delaying circuit 410, and inputs the delayed pulse signal b1 outputted from the third inverter 414. The other transmission gate 430 also has a first gate 431 and a second gate 432. The delayed pulse signal b2 outputted from the second inverter 415 is applied to the first gate 431, and the delayed pulse signal b3 outputted from the first inverter 416 is applied to the second gate 432. In response to the two delayed pulse signals b2, b3 being applied, respectively, to the first gate 431 and the second gate 432, the other transmission gate 430 controls the passage of the inputted delayed pulse signal b1 so that it connects the inputted pulse signal a, blocked when the transmission gate 420 is turned off prior to passage of the trailing edge, to the displaced portion (rising portion) of the delayed pulse signal b1, and gives the outputted pulse signal c a predetermined pulse width, and then generates an outputted pulse signal c. (See the operation waveform diagram from a simulation of the circuit 400 shown in FIG. 5). By adjusting the amount of delay for the delayed pulse signals b1, b2, b3, the pulse width of the outputted pulse signal c can be adjusted. The amount of delay can also be adjusted by changing the gate size or by changing the number of steps in the delay inverters.

Figure 1:
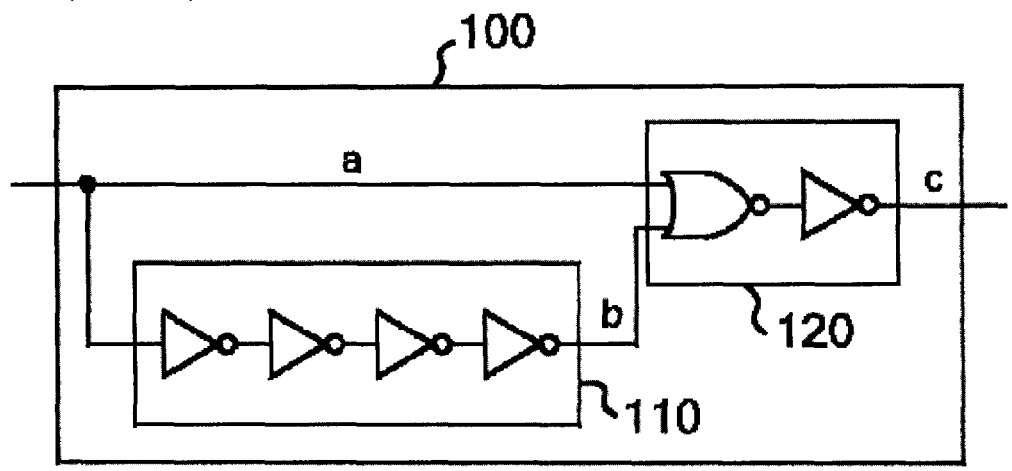
FIG. 1 is a circuit diagram of a pulse width delaying circuit of the prior art.
Figure 5:
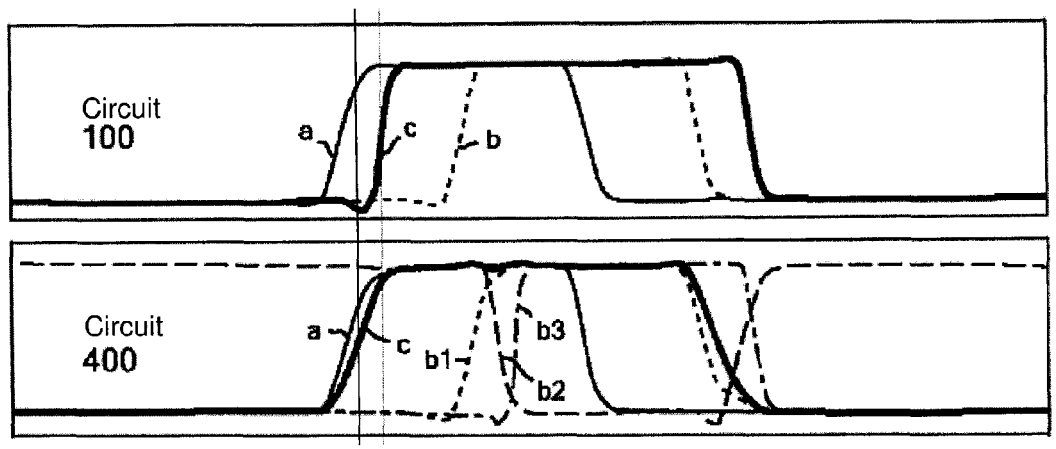
FIG. 5 is an operation waveform diagram from a simulation of the circuits shown in FIG. 1 and FIG. 4.

FIG. 5 is an operation waveform diagram from a simulation of circuits 100 and 400 shown in FIG. 1 and FIG. 4. When the pulse width of the pulse signals is extended, the leading edge position of the outputted pulse signals c from the circuit 400 in this example (the lower end of FIG. 5) is shifted to the left more quickly than the leading edge position of the outputted pulse signals c from the circuit 100 of the prior art. This clearly reduces the leading edge delay of the outputted pulse signals c (pulse signals whose pulse width has been adjusted).

Figure 6:
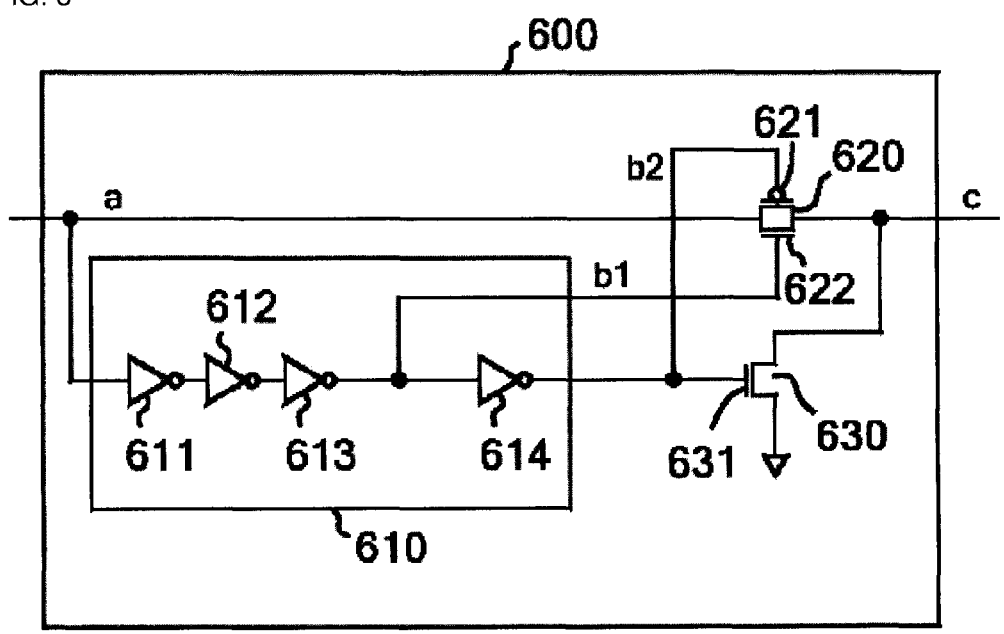
FIG. 6 is a circuit diagram showing the first example of the pulse width adjusting circuit.

FIG. 6 shows one example of a pulse width adjusting circuit 600. The pulse width adjusting circuit 600 is operated to shorten the pulse width of the pulse signals. In the pulse width adjusting circuit 600, a rising pulse is used in the inputted pulse signals a. The pulse delaying circuit 610 is four series-connected inverters 611-614, and two different delayed pulse signals b2, b1 are outputted from the first and second inverters 614, 613 on the output end. The transmission gate 620 has a first gate 621 and a second gate 622. The delayed pulse signal b2 outputted from the first inverter 614 is applied to the first gate 621, and the delayed pulse signal b1 outputted from the second inverter 613 is applied to the second gate 622. By applying the delayed pulse signals b2, b1 to the first gate 621 and the second gate 622, respectively, the transmission gate 620 is controlled to turn on until the leading edge of the inputted pulse signal a has passed, to turn off before the trailing edge of the inputted pulse signal a has passed, and to be turned on with the appropriate timing when the outputted pulse signal c reaches a predetermined pulse width and thereafter. (See the operation waveform diagram from a simulation of the circuit 600 shown in FIG. 7).

A NFET 630 is connected between the ground voltage and the output of the transmission gate 620 to create a pulse width setting circuit. The gate 631 of the NFET 630 is connected to the output of the first inverter 614. The delayed pulse signal b2 outputted from the first inverter 614 is applied to the first gate 621 of the transmission gate 620, and is also applied to the gate 631 of the NFET 630. In this way, the outputted pulse signal c reaches the predetermined pulse width from the unaltered input pulse signal a blocked by the transmission gate 620 turned off before the trailing gate passes, and an outputted pulse signal c is generated. (See the operation waveform diagram from a simulation of the circuit 600 shown in FIG. 7). By adjusting the amount of delay for the delayed pulse signals b1, b2, the pulse width of the outputted pulse signal c can be adjusted. The amount of delay can also be adjusted by changing the gate size or by changing the number of steps in the delay inverters.

Figure 2:
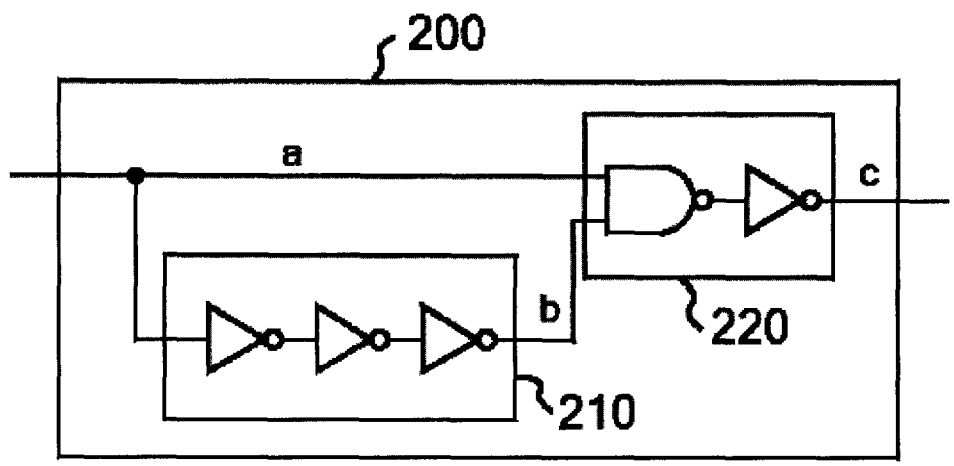
FIG. 2 is a circuit diagram of a pulse width shortening circuit of the prior art.
Figure 7:
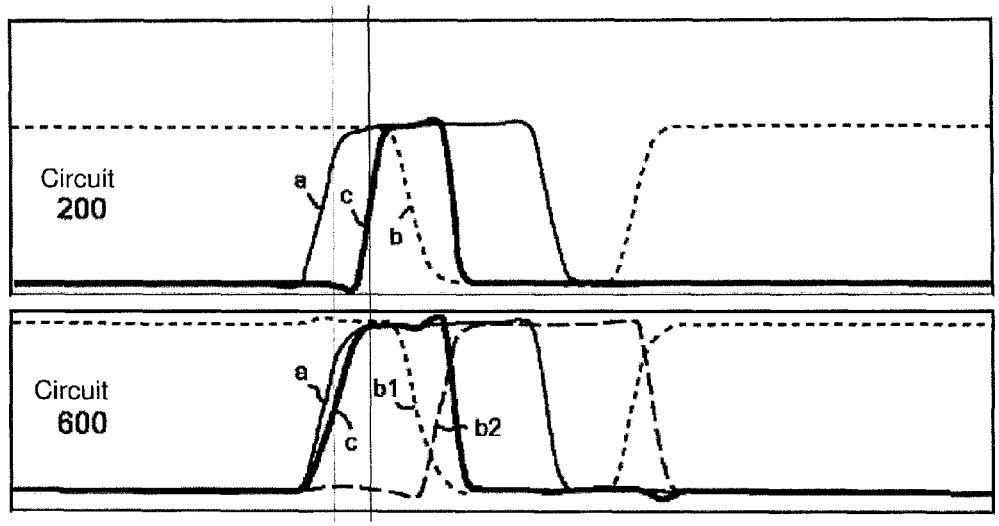
FIG. 7 is an operation waveform diagram from a simulation of the circuits shown in FIG. 2 and FIG. 6.

FIG. 7 is an operation waveform diagram from a simulation of circuits 200 and 600 shown in FIG. 2 and FIG. 6. When the pulse width of the pulse signals is shortened, the leading edge position of the outputted pulse signals c from the circuit 600 in this example (the lower end of FIG. 7) is shifted to the left more quickly than the leading edge position of the outputted pulse signals c from the circuit 200 of the prior art. This clearly reduces the leading edge delay of the outputted pulse signals c (pulse signals whose pulse width has been adjusted).

Figure 8:
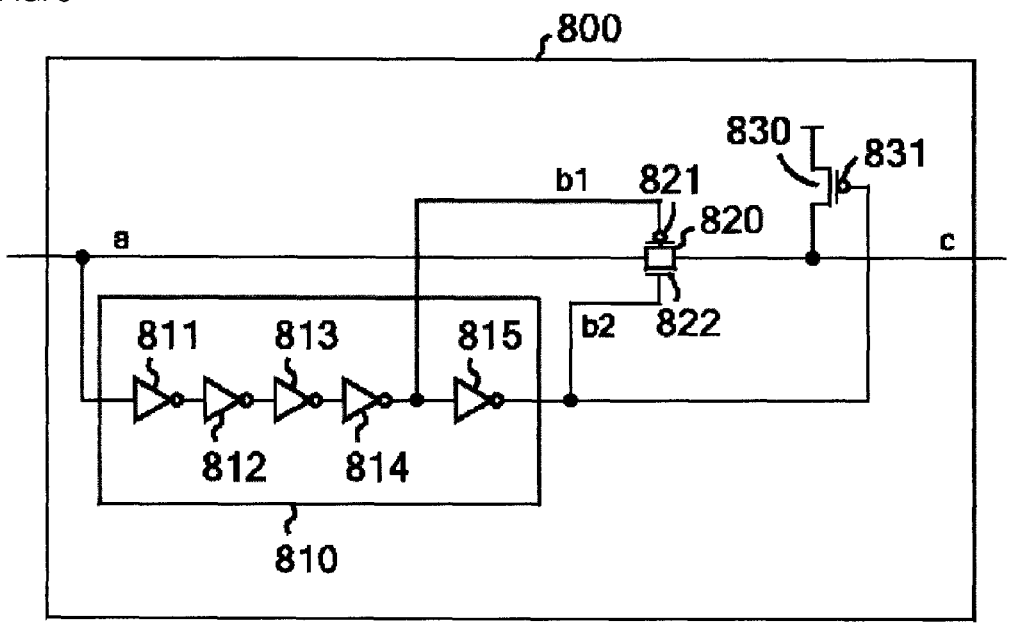
FIG. 8 is a circuit diagram showing the first example of the pulse width adjusting circuit.
Figure 9:
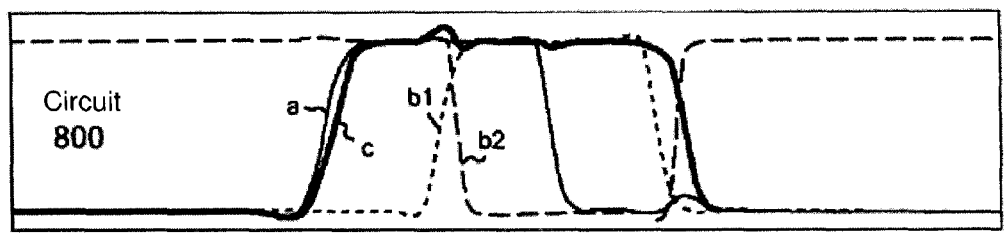
FIG. 9 is an operation waveform diagram from a simulation of the circuit shown in FIG. 8.

FIG. 8 shows one example of a pulse width adjusting circuit 800. The pulse width adjusting circuit 800 is operated to extend the pulse width of pulse signals. In the pulse width adjusting circuit 800, a rising pulse is used in the inputted pulse signals a. The pulse delaying circuit 810 is five series-connected inverters 811-815, and two different delayed pulse signals b2, b1 are outputted on the output end from the first and second inverters 815, 814. The transmission gate 820 has a first gate 821 and a second gate 822. The delayed pulse signal b1 outputted from the second inverter 814 is applied to the first gate 821, and the delayed pulse signal b2 outputted from the first inverter 815 is applied to the second gate 822. By applying delayed pulse signals b1 and b2 to the first gate 821 and the second gate 822, respectively, the transmission gate 820 is controlled so as to be turned on until the leading edge of the inputted pulse signal a has passed, so as to be turned off before the trailing edge of the inputted pulse signal a has passed, and so as to be turned on when the outputted pulse signal c reaches a predetermined pulse width. (See the operation waveform diagram from a simulation of the circuit 800 shown in FIG. 9).

A PFET 830 is connected between the power supply voltage and the output of the transmission gate 820 to create a pulse width setting circuit. The gate 831 of the PFET 830 is connected to the output of the first inverter 815. The delayed pulse signal b2 outputted from the first inverter 815 is applied to the second gate 822 of the transmission gate 820, and is also applied to the gate 831 of the PFET 830. When the delayed pulse signal b2 is applied to the gate 831 of the PFET 830, the PFET 830 is turned on, and the output of the transmission gate 820 is held at a high voltage. In this way, the PFET 830 is turned on so that the inputted pulse signal a, blocked when the transmission gate 820 is turned off prior to passage of the trailing edge, is connected to the high voltage portion in the output of the transmission gate 820, so that the outputted pulse signal c has a predetermined pulse width, and then an outputted pulse signal c is generated. (See the operation waveform diagram from a simulation of the circuit 800 shown in FIG. 9). By adjusting the amount of delay for the delayed pulse signals b1, b2, the pulse width of the outputted pulse signal c can be adjusted. The amount of delay can also be adjusted by changing the gate size or by changing the number of steps in the delay inverters.

Figure 10:
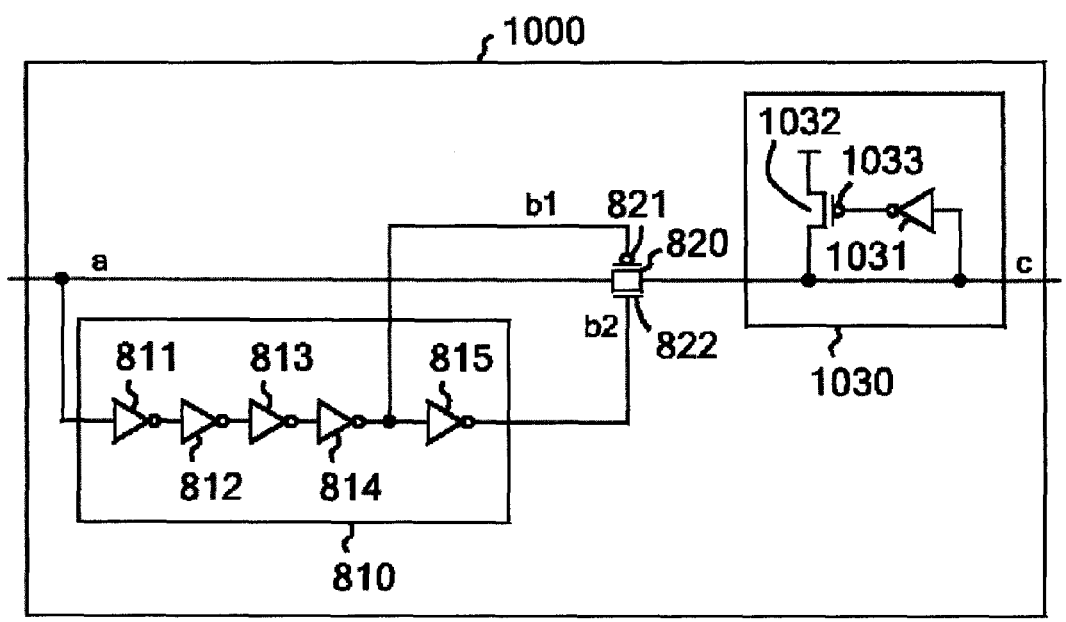
FIG. 10 is a circuit diagram showing the first example of the pulse width adjusting circuit.

FIG. 10 shows one example of a pulse width adjusting circuit 1000. The pulse width adjusting circuit 1000 is operated to extend the pulse width of pulse signals. In the pulse width adjusting circuit 1000, a rising pulse is used in the inputted pulse signals a. The pulse delaying circuit 810 and the transmission gate 820 have the same configuration as the circuits shown in FIG. 8, but the pulse width setting circuit 1030 has a different configuration than the circuit shown in FIG. 8. This pulse width setting circuit 1030 will be explained.

Figure 11:
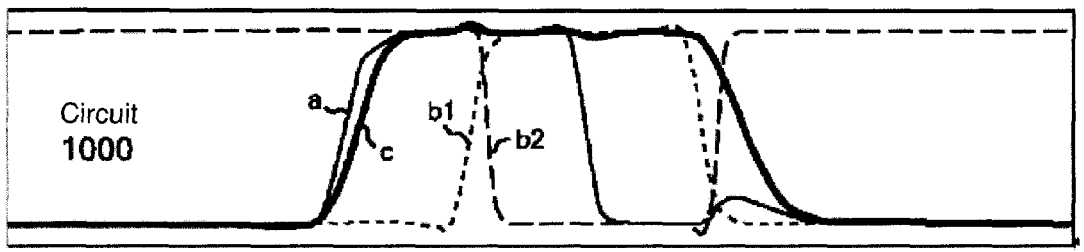
FIG. 11 is an operation waveform diagram from a simulation of the circuit shown in FIG. 10.

The pulse width setting circuit 1030 is an inverter 1031 and a PFET 1032. The input of the inverter 1031 is connected to the output of the transmission gate 820, and the output is connected to the gate 1033 of the PFET 1032. The PFET 1032 is connected between the power supply voltage and the output of the transmission gate 820. Because the pulse width setting circuit 1030 is not connected to the pulse delaying circuit 810, it does not operate in response to a delayed pulse signal outputted from the pulse delaying circuit 810. The pulse width setting circuit 1030 operates in response to the output voltage of the transmission gate 820. The output voltage of the transmission gate 820 is high when the transmission gate 820 is turned on and the leading edge of the inputted pulse signal a has passed. It is also high when the transmission gate 820 is turned off before the trailing edge of the inputted pulse signal a has passed. Because high voltage is already inputted to the inverter 1031 and the PFET 1032 has been turned on, high voltage is maintained until the transmission gate 820 is turned from off to on, and the low voltage of the inputted pulse signal a has passed. In this way, the PFET 1032 is turned on so that the inputted pulse signal a, blocked when the transmission gate 820 is turned off prior to passage of the trailing edge, is connected to the high voltage portion in the output of the transmission gate 820, and then an outputted pulse signal c is generated. (See the operation waveform diagram from a simulation of the circuit 1000 shown in FIG. 11). By adjusting the amount of delay for the delayed pulse signals b1, b2 used to control not the pulse width setting circuit 1030 but the transmission gate 820, the pulse width of the outputted pulse signal c can be adjusted. The amount of delay can also be adjusted by changing the gate size or by changing the number of steps in the delay inverters.

FIG. 12 includes tables showing examples of leading edge delay reduction rates for pulse signals with pulse width adjustment performed by the circuits in the examples. The data shown in the tables is obtained from operation waveforms from the simulations of the circuits. Here, (A) shows a circuit which extends the pulse width of pulse signals, and (B) shows a circuit which shortens the pulse width of pulse signals. Compared to the prior art circuit 100, circuits 400, 800 and 1000 in the examples reduced the amount of delay Δ by 6.4 ps, 7.1 ps and 6.1 ps, respectively, and had rates of reduction in the amount of delay of 67%, 74% and 64%, respectively. Compared to the prior art circuit 200, circuit 600 in the example reduced the amount of delay A by 9.6 ps, and had a rate of reduction in the amount of delay of 77%. With respect to the leading edge, as shown in FIG. 5 and FIG. 7, the waveform change start point of the inputted pulse signal a and the waveform start point of the outputted pulse signal c were clearly different in circuits 100 and 200 of the prior art. However, as shown in FIG. 5, FIG. 7, FIG. 9 and FIG. 11, the waveform change start point of the inputted pulse signal a and the waveform start point of the outputted pulse signal c were nearly equal in circuits 400, 600, 800 and 1000 of the example. Therefore, by adjusting the size of the driver and the size of the transmission gate in the preceding step, the throughput of the pulse signals can be improved, and the delay can be further reduced.

The present invention was explained above with reference to an embodiment, but the technical scope of the present invention is not limited to the scope of the description of this embodiment. The addition of various changes or improvements to the present embodiment is possible, and the addition of these changes or improvements is included in the technical scope of the present invention. For example, the PFET and NFET can be replaced by a commonly used CMOS circuit, and the polarity of the signals can be reversed. In other words, the rising pulse can be reversed and a falling pulse used.

The invention claimed is:

1. A pulse width adjusting circuit comprising:
    a pulse delaying circuit for inputting an inputted pulse signal and for outputting a plurality of different delayed pulse signals;
    a transmission gate for inputting the inputted pulse signal and controlling the passage of the inputted pulse signal in response to the application of two delayed pulse signals from among the plurality of different delayed pulse signals;
    a pulse width setting circuit connected to the transmission gate for setting a pulse width of an outputted pulse signal generated on the basis of the inputted pulse signal passing through the transmission gate; and
    wherein the pulse delaying circuit is an even number of four or more inverters connected in series, three different delayed pulse signals are outputted from the first, second and third inverters counting from the output end, and the two delayed pulse signals outputted from the first and second inverters are applied, respectively, to the first gate and second gate of the transmission gate.

2. A pulse width adjusting circuit according to claim 1, wherein the transmission gate is turned on until the leading edge of the inputted pulse signal passes by applying the two delayed pulse signals, is turned off before passage of the trailing edge of the inputted pulse signal, and is turned on when the outputted pulse signal reaches a predetermined pulse width or thereafter.

3. A pulse width adjusting circuit according to claim 2, wherein the pulse width setting circuit is maintained in a state displaced by the leading edge of the inputted pulse signal while the outputted pulse signal is a predetermined pulse width when the transmission gate has been turned off.

4. A pulse width adjusting circuit according to claim 3, wherein the pulse delaying circuit is an even number of four or more inverters connected in series, three different delayed pulse signals are outputted from the first, second and third inverters counting from the output end, and the two delayed pulse signals outputted from the first and second inverters are applied, respectively, to the first gate and second gate of the transmission gate.

5. A pulse width adjusting circuit according to claim 4, wherein the pulse width setting circuit comprises another transmission gate connected to the pulse delaying circuit for inputting the delayed pulse signal outputted from the third inverter counting from the output end, and for controlling the passage of the inputted delayed pulse signal in response to the application of the two delayed pulse signals outputted from the first and second inverters, respectively, to the second gate and the first gate.

6. A pulse width adjusting circuit according to claim 3, wherein the pulse delaying circuit is an odd number of three or more inverters connected in series, two different delayed pulse signals are outputted from the first and second inverters counting from the output end, and the two delayed pulse signals outputted from the first and second inverters are applied, respectively, to the second gate and first gate of the transmission gate.

7. A pulse width adjusting circuit according to claim 6, wherein the inputted pulse signal is a rising pulse, and wherein the pulse width setting circuit comprises a PFET connected between the power supply voltage and the output of the transmission gate and having a gate connected to the output of the first inverter counting from the output end.

8. A pulse width adjusting circuit according to claim 6, wherein the inputted pulse signal is a rising pulse, and wherein the pulse width setting circuit comprises an inverter whose input is connected to the output of the transmission gate, and a PFET connected between the power supply voltage and the output of the transmission gate and having a gate connected to the output of the inverter.

9. A pulse width adjusting circuit according to claim 3, wherein the pulse delaying circuit is an even number of two or more inverters connected in series, two different delayed pulse signals are outputted from the first and second inverters counting from the output end, and the two delayed pulse signals outputted from the first and second inverters are applied, respectively, to the first gate and second gate of the transmission gate.

10. A pulse width adjusting circuit according to claim 9, wherein the inputted pulse signal is a rising signal, and wherein the pulse width setting circuit comprises an NFET connected between the ground voltage and the output of the transmission gate and having a gate connected to the output of the first inverter counting from the output end.

11. A pulse width adjusting circuit according to claim 1, wherein the pulse width setting circuit comprises another transmission gate connected to the pulse delaying circuit for inputting the delayed pulse signal outputted from the third inverter counting from the output end, and for controlling the passage of the inputted delayed pulse signal in response to the application of the two delayed pulse signals outputted from the first and second inverters, respectively, to the second gate and the first gate.

12. A pulse width adjusting circuit according to claim 2, wherein the pulse delaying circuit is an odd number of three or more inverters connected in series, two different delayed pulse signals are outputted from the first and second inverters counting from the output end, and the two delayed pulse signals outputted from the first and second inverters are applied, respectively, to the second gate and first gate of the transmission gate.

13. A pulse width adjusting circuit according to claim 12, wherein the inputted pulse signal is a rising pulse, and wherein the pulse width setting circuit comprises a PFET connected between the power supply voltage and the output of the transmission gate and having a gate connected to the output of the first inverter counting from the output end.

14. A pulse width adjusting circuit according to claim 12, wherein the inputted pulse signal is a rising pulse, and wherein the pulse width setting circuit comprises an inverter whose input is connected to the output of the transmission gate, and a PFET connected between the power supply voltage and the output of the transmission gate and having a gate connected to the output of the inverter.

15. A pulse width adjusting circuit according to claim 2, wherein the pulse delaying circuit is an even number of two or more inverters connected in series, two different delayed pulse signals are outputted from the first and second inverters counting from the output end, and the two delayed pulse signals outputted from the first and second inverters are applied, respectively, to the first gate and second gate of the transmission gate.

16. A pulse width adjusting circuit according to claim 15, wherein the inputted pulse signal is a rising signal, and wherein the pulse width setting circuit comprises an NFET connected between the ground voltage and the output of the transmission gate and having a gate connected to the output of the first inverter counting from the output end.

17. A pulse width adjusting method comprising the steps of:
generating a series of different delayed pulse signals from an inputted pulse signal, wherein the series of different delayed pulse signals comprises an even number of four or more delayed pulse signals;
applying the last two delayed pulse signals from among the series of different delayed pulse signals to a transmission gate, and controlling the passage of the inputted pulse signal through the transmission gate; and
setting a pulse width of the output pulse signal generated on the basis of the inputted pulse signal passing through the transmission gate to a predetermined pulse width.

18. A pulse width adjusting method according to claim 17, wherein controlling the passage of the inputted pulse signal through the transmission gate includes turning on the transmission gate until the leading edge of the inputted pulse signal passes by applying the two delayed pulse signals, turning off the transmission gate before passage of the trailing edge of the inputted pulse signal, and turning on the transmission gate when the outputted pulse signal reaches a predetermined pulse width or thereafter.

19. A pulse width adjusting method according to claim 18, wherein setting the pulse width of the inputted pulse signal to a predetermined pulse width includes maintaining a state displaced by the leading edge of the inputted pulse signal while the outputted pulse signal is a predetermined pulse width when the transmission gate has been turned off.

* * * * *